United States Patent [19]

Cheng

[11] Patent Number: 5,455,436

[45] Date of Patent: Oct. 3, 1995

[54] PROTECTION CIRCUIT AGAINST ELECTROSTATIC DISCHARGE USING SCR STRUCTURE

[75] Inventor: Wen-Bor Cheng, Tainan, Taiwan, Prov. of China

[73] Assignee: Industrial Technology Research Institute, Hsinchu, Taiwan, Prov. of China

[21] Appl. No.: 246,165

[22] Filed: May 19, 1994

[51] Int. Cl.$^6$ ............................. H01L 29/06; H01L 29/78
[52] U.S. Cl. ......................... 257/356; 257/362; 257/408
[58] Field of Search ...................................... 257/110, 141, 257/127, 355, 360, 361, 362, 356, 408; 361/58, 56, 100

[56] References Cited

U.S. PATENT DOCUMENTS

| | | | |
|---|---|---|---|
| 5,182,220 | 1/1993 | Ker et al. ................................. | 437/34 |
| 5,225,702 | 7/1993 | Chatterjee ............................... | 257/360 |

OTHER PUBLICATIONS

Chatterjee et al. "A Low Voltage Triggering SCR for On–Chip ESD Protection at Output and Input Pads", IEEE Elet. Dev. Let. vol. 12 Jan. 1991 pp. 21–22.

*Primary Examiner*—Jerome Jackson
*Assistant Examiner*—Donald L. Monin, Jr.
*Attorney, Agent, or Firm*—H. C. Lin

[57] ABSTRACT

The output buffer using an LDD NMOS is protected with an SCR at the output pad against electrostatic discharge (ESD). An abrupt (non-LDD) junction NMOS is used as the equivalent npn transistor in the pnpn SCR structure in a dedicated n-well. The non-LDD NMOS has a lower avalanche breakdown voltage than the LDD NMOS buffer, and triggers the SCR to turn on before the avalanche breakdown of the LDD transistor. This non-LDD NMOS lowers the trigger voltage and diverts the ESD current from flowing through the buffer to avoid damage to the buffer.

Besides the n-well for forming the protective SCR, auxiliary n+diffusions and n-wells are placed outside the n-well for to form drains of another non-LDD NMOS, which are connected to the positive power supply. These non-LDD NMOS act as npn transistor and are turned on when high voltage ESD pulses appears at the I/O pad or any power supply terminal to shunt the ESD current to ground, thus avoiding latch-up between the power supply terminals. The output buffer using an LDD NMOS is protected with an SCR at the output pad against electrostatic discharge (ESD). An abrupt (non-LDD) junction NMOS is used as the equivalent npn transistor in the pnpn SCR structure in a dedicated n-well. The non-LDD NMOS has a lower avalanche breakdown and a longer channel length than the LDD NMOS buffer, and triggers the SCR to turn on before the avalanche breakdown of the LDD transistor. This non-LDD NMOS lowers the trigger voltage and diverts the ESD current from flowing through the buffer to avoid damage to the buffer. Besides the n-well for forming the protective SCR, auxiliary n+diffusions and n-wells are placed outside the n-well to form collectors of npn transistors, which are connected to the positive power supply. These npn transistors are turned on when high voltage ESD pulses appear at the I/O pad or any power supply terminal to shunt the ESD current to ground, thus avoiding latch-up between the power supply terminals.

16 Claims, 4 Drawing Sheets

| TEST MODEL DW | HBM +/Vss | MM +/Vss |
|---|---|---|
| Built-in SCR devide width (DW) 100um | >8KV | >600V |

TABLE I 5,455,436

PROTECTION CIRCUIT AGAINST ELECTROSTATIC DISCHARGE USING SCR STRUCTURE

BACKGROUND OF THE INVENTION

This invention relates to protection circuits at the input and output pads of integrated circuits (IC), especially for complementary metal-oxide-semiconductor (CMOS) IC.

Electrostatic Discharge (ESD) is a serious problem in IC design. Due to electrostatic potential buildup in a human body, the static voltage as high as thousands of volts can appear at the input and output bonding pads of an IC and cause catastrophic failures by excessive current through the output device or the power supply. For reliability, the IC must be designed to protect against such ESD.

For the protection at input pads, the high ESD voltage can be clamped by a Zener diode through a high resistance. However, such a scheme is not useful for the output pads, because the high resistance would drop the output voltage.

For the protection at the output pads, any ESD voltage must be clamped to a low voltage without any series resistance. Recently, the silicon controlled rectifier (SCR) with a pnpn structure has been proposed for protection at the output pad, as described by A. Chatterjee and T. Polgreen in a paper, "A Low-Voltage Triggering SCR for On-Chip ESD Protection at Output and Input Pads", *IEEE Electron Device Letters*, Vol.12, No.1, January 1991, pp.21–22. The low on voltage of an SCR is utilized to clamp the output pads. This prior art is known as a "LVTSCR" protection circuit and is shown in FIG. 1. The basic structure is an n-well CMOS IC. The output device to be protected is an n-channel metal-oxide-semiconductor transistor (NMOS) pull-down device with a lightly-doped drain (LDD) structure. The LDD structure is widely used to reduce the undesirable "short-channel effect". This NMOS has a source 12 connected to ground and a drain 10 connected the output pad 11. Low-doped diffusions 16 and 18 are placed next the drain 10 and source 12 respectively. The ESD protection is furnished by the SCR structure 80 shown in the left-hand side of FIG. 1. The SCR comprises an n-well 78 and an LDD NMOS 82 with an n+ source 70 and an n+ drain 72 butted against the n-well 78. Inside the n-well is a butted p+diffusion 74 and an n+diffusion 76, which are connected to the output pad 11. The pnpn structure for the SCR is formed by the p+ diffusion 74, n-well 78, p-substrate 80 and n+diffusion 70. An SCR is equivalent to a pnp transistor and an npn transistr connected in a feedback loop. In FIG. 1, the equivalent npn transistor has the n+ diffusion 72 as collector, p-substrate 80 as base and n+diffusion 70 as emitter. The equivalent pnp transistor has p-substrate 80 as collector, the n-well 78 as base and the p+diffusion 74 as emitter. To trigger the SCR from off condition to the low voltage on condition, at least one of the equivalent transistors must be sufficiently turned on with a current to cause the closed loop current gain of the equivalent pnp-npn feedback circuit equal to unity. One method to sufficiently turn on the equivalent npn transistor is to utilize the avalanche breakdown voltage of the n+p– collecotr junction (72/80). When a voltage exceeding the breakdown voltage appears at the I/O pad 11, a large base current flows into the equivalent npn transistor to turn on the SCR. In this LVTSCR protection circuit, the NMOS 82 has the same LDD structure as the output pull-down NMOS 15. For effective protection, the avalanche breakdown voltage of the NMOS 82 in the LVTSCR circuit must be lower than that of the output pull-down NMOS 15. Otherwise the output pull-down NMOS 15 may suffer from thermal runaway. For this reason, the channel length of the triggering NMOS 82 must be shorter than that of the pull-down NMOS 15. However, when the channel is too short, short-circuit may occur. Therefore, the manufacturing torlerance is very small.

SUMMARY

An object of this invention is to implement SCR protection for an LDD-type NMOS output buffer at the input/output pad of an IC against electrostatic discharge. Another object of this invention is to implement SCR protection at the input/output pad without causing any latch-up of the CMOS structure. Still another object of the present invention is to implement SCR protection without requiring any high resolution lithography which may lower the manufacturing yield.

These objects are achieved by using an NMOS with an abrupt drain (non-LDD) Junction instead of the LDD junction. This NMOS forms the euqivalent npn trnasistor of the protective pnpn SCR structure. The abrupt drain junction produces a lower avalanche breakdown voltage than the LDD junction. When a high voltage ESD pulse appears at the output pad, the non-LDD junction breaks down before the LDD junction and triggers the SCR associated with non-LDD NMOS to turn on. Then, the output pad is clamped to nearly the holding voltage of the SCR, which is very low.

Latch-up is avoided by placing some auxiliary n+diffusions and n-wells around the protective SCR and connected to the positive power supply. The auxiliary n+diffusion forms the collector of an npn transistor, which is turned on when high voltage appears at the positive supply terminal and avoid any latch-up between the positive and negative supply terminals.

DETAILED DESCRIPTION OF THE PREFERRED EMBODIMENT

Figure 1:
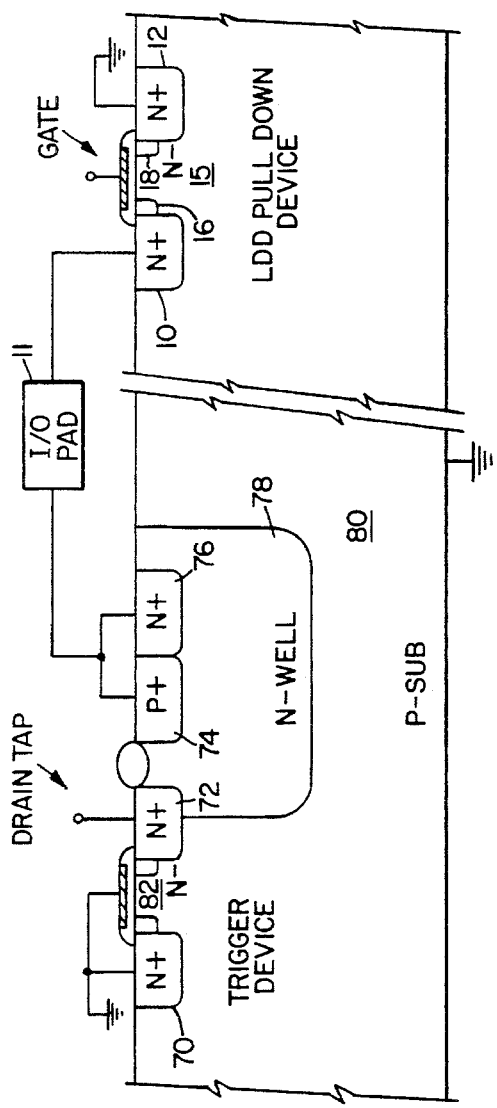
FIG. 1 shows a prior art IC structure for ESD protection.
Figure 2:
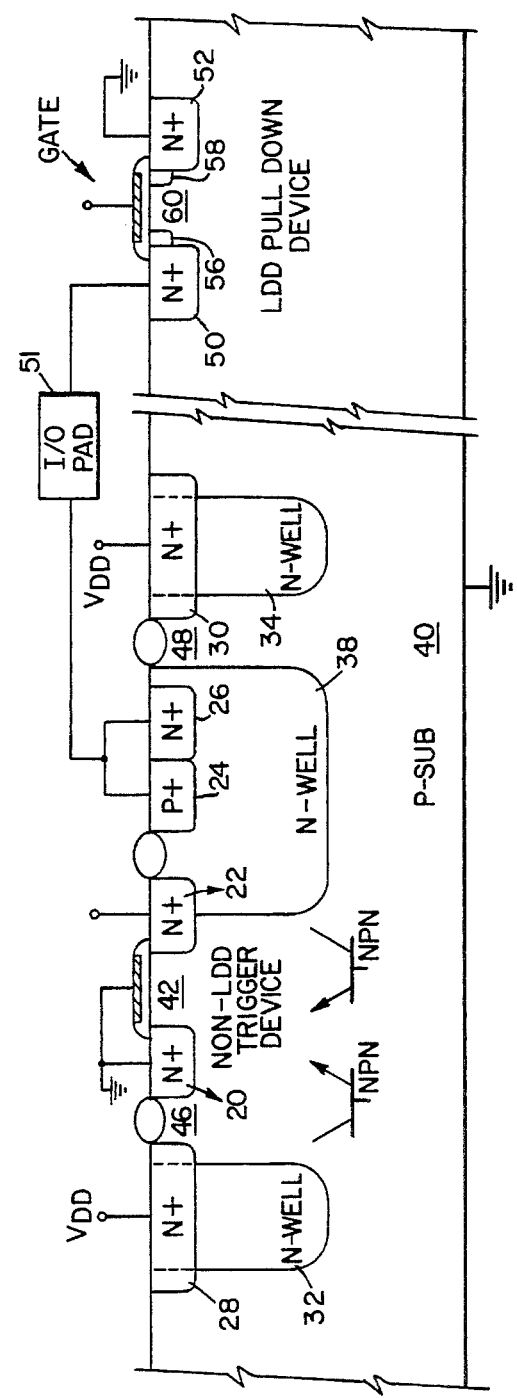
FIG. 2 shows an ESD protection circuit of the present invention.

FIG. 2 shows the cross-section of the present invention for ESD protection. Similar to FIG. 1, an SCR is used for ESD protection. The protection circuit in FIG. 2 comprises an NMOS 42, an n-well 38 in which a p+n+ junction is diffused, and two other auxiliary n-wells 32 and 34 covered with n+diffusions 28 and 30 respectively at the surface of the IC structure with a p-substrate. The NMOS 42 has a source 20 which is connected with the gate to ground, and a drain 22 which is not lightly-doped (non-LDD) and partly diffused into the n-well 38. The two auxiliary n-wells 32 and 34 are connected to the positive power supply $V_{DD}$. The p+n+ junction 24/26 is short-circuited and connected to the input/output pad 51 where high ESD voltages may appear.

(a) For positive ESD pulse applied at the I/O pad 51 with reference to ground or $V_{SS}$, the breakdown voltage of the non-LDD n+p-substrate junction 22/40 triggers on the pnpn SCR structure formed by the p+diffusion 24, n-well 38, p-substrate 40 and n+diffusion 20 in the n-well. The SCR then clamps the ESD pulse.

(b) For a negative ESD pulse applied at the I/O pad 51 with reference to ground or $V_{SS}$, the p-substrate n-well junction 38/22 is forward biased. The npn transistor, formed by the n+diffusion 20 as collector, p-substrate 40 as base and n+diffusion 22 as emitter, is connected as a forward-biased diode with the collector short-circuited to the base. Thus, the output pad 11 is effectively connected to the ground through one forward-biased diode.

(c) For a positive ESD pulse appearing at the pad 51 with respect with the $V_{DD}$ terminal, the protective SCR pnpn structure is formed by the p+diffusion 24, n-well 38, p-substrate 40 and n+/n-well diffusions 30/34 (or 28/32). The low breakdown voltage of the non-LDD n+junction 22 triggers the SCR to turn on.

(d) For a negative ESD pulse appearing at the pad 51 with respect to the $V_{DD}$ terminal, the protection is furnished by an npn transistor 46 which bypasses any parasitic pnpn structure between the $+V_{DD}$ terminal and the ground or $-V_{SS}$ terminal. This bypass npn transistor 46 is formed with n+diffusion 28 as a collector (known as "pseudo collector" or "minority guard"), p-substrate 40 as base, and n+diffusion 20 as emitter. In a typical latch-up situation of a CMOS structure, a parasitic pnpn structure exists with a p+ source of a PMOS in an n-well (not shown in FIG. 2) as anode connected to +VDD, p-substrate 40 and the internal n+ junction connected to $V_{SS}$ (or ground) as cathode connected to ground. When there is negative ESD pulse with respect to $V_{DD}$, the diode 38/40 is forward biased, charging $V_{SS}$ to be negative and causing a high voltage between $V_{DD}$ and $V_{SS}$. However, with the bypass npn transistor 46, the breakdown of the junction (28/40) turns on this npn transistor 46, forms a current path between $+V_{DD}$ at the n+ diffusion 28 and the ground connection at the n+diffusion 20, and prevents the parasitic pnpn structure between $+V_{DD}$ and ground to turn on and to cause internal damage due to latch-up.

(e) For protection of ESD between the power pins $V_{DD}$ and ground or $V_{SS}$, the npn transistor 46 is used to prevent any parasitic pnpn action to take place as explained in (d). The n+diffusion 28/n-well 32 serves as the collector; the p-substrate 40, the base; n+diffusion 20, the emiter. A high voltage appearing at the $V_{DD}$ pin causes avalanche breakdown at the n+p-substrate junction 28/40, increasing the base current and turning on the npn transistor 46. The npn transistor then provides a low resistance path between $V_{DD}$ and ground, and bypasses the ESD pulse from reaching any internal circuit to cause damages.

(f) From the explanation in (d) and (e), it can be seen that the auxiliary n-well with n+diffusion 28 over n-well 32 and n+diffusion 30 over n-well 34 form pseudo collectors of bypass npn transistors to prevent latch-up. For effective ESD protection, the triggering NMOS 42 does not have a lightly-doped drain or source junctions. The structure is different from the output pull-down device.

Similarly, the npn structure 46 also does not have a lightly doped emitter and collector junction.

When a junction is not light-doped, the junction is an abrupt one. The avalanche breakdown of an abrupt junction is lower than that of a light-doped junction. Thus, it can be assured that the trigger device 42 turns on before the pull-down device 60 breaks down. With a lower trigger voltage, it is not necessary to make the channel length of the trigger device 42 extraordinarily short and a longer channel length can be tolerated. For example, the pull-down LDD device 60 may have a channel of 1.0 um, while the non-LDD trigger device channel length can be 1.2 um to offer adequate protection.

The non-LDD trigger device can be either a thin oxide NMOS device or a thick field oxide device (TFD). The thick field oxide is ordinarily used outside the thin gate oxide region of a conventional MOS transistor. Depending on the process, the TFD sometimes may have a lower breakdown voltage than the LDD NMOS. This low trigger voltage is lower than any other trigger voltags which may turn on some parasitic npn bipolar transistors or pnpn structures, and thus insures that there is no internal circuit failure.

Figure 3:
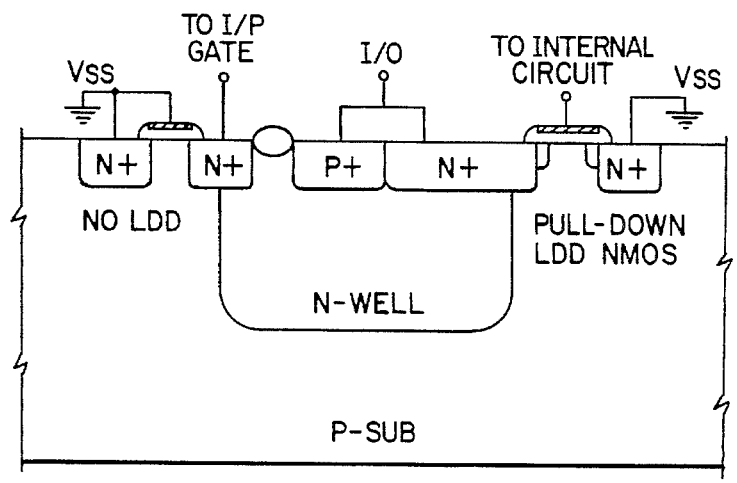
FIG. 3 shows the cross section of an NMOS output buffer with built-in SCR ESD protection.

The LVTSCR device of the present invention can be used without the auxiliary n-wells to form a compact structure, as shown in FIG. 3. This structure can insure that the non-LDD device triggers first, and at the same time save area.

Figure 4:
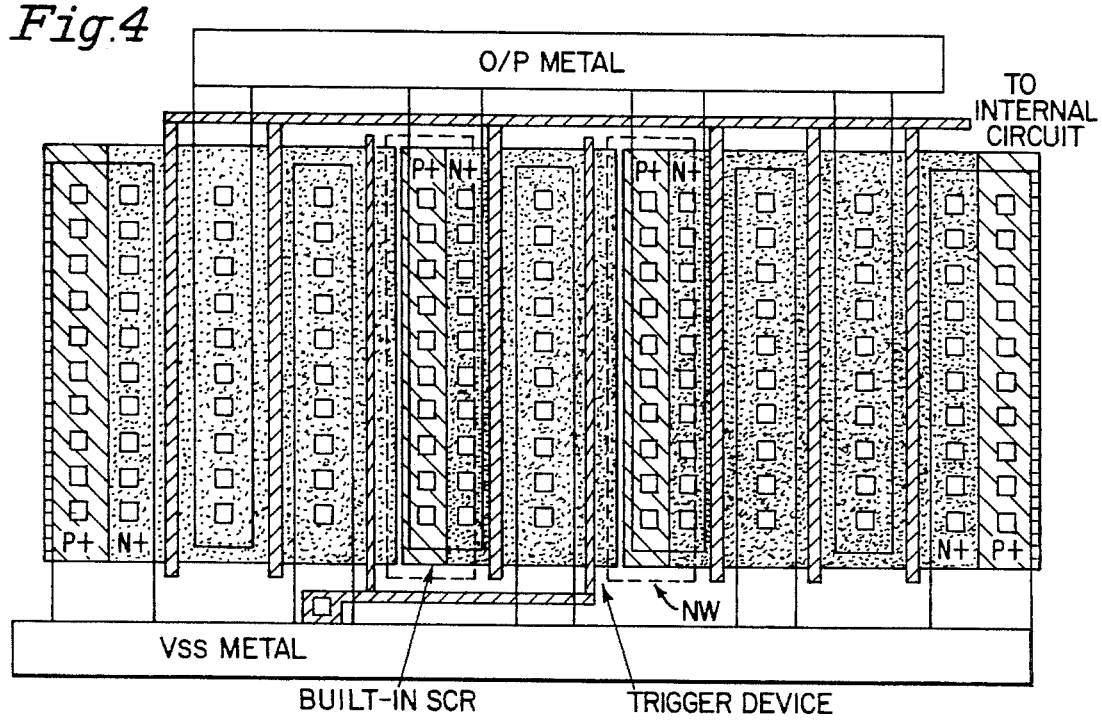
FIG. 4 shows the layout of the output buffer with built-in SCR ESD protection.

FIG. 4 shows the actual layout of an output pull-down NMOS together with built-in SCR protection. The output pull-down NMOS uses a ladder design with multiple number of contacts (shown as squares) customarily used for power devices to equalize current distribution. The layout corresponds to the cross-section view of FIG. 3.

Figure 5:
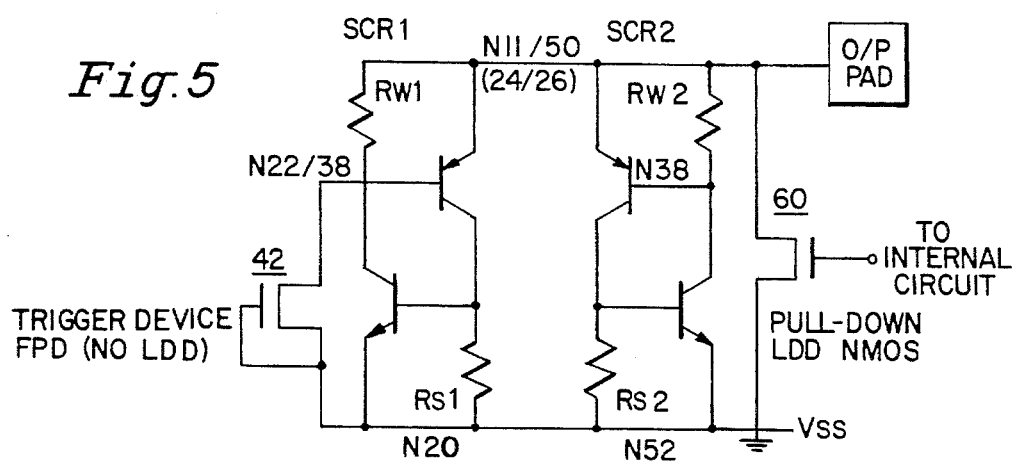
FIG. 5 shows the equivalent circuit of the output buffer with built-in SCR ESD protection.
Figure 6:
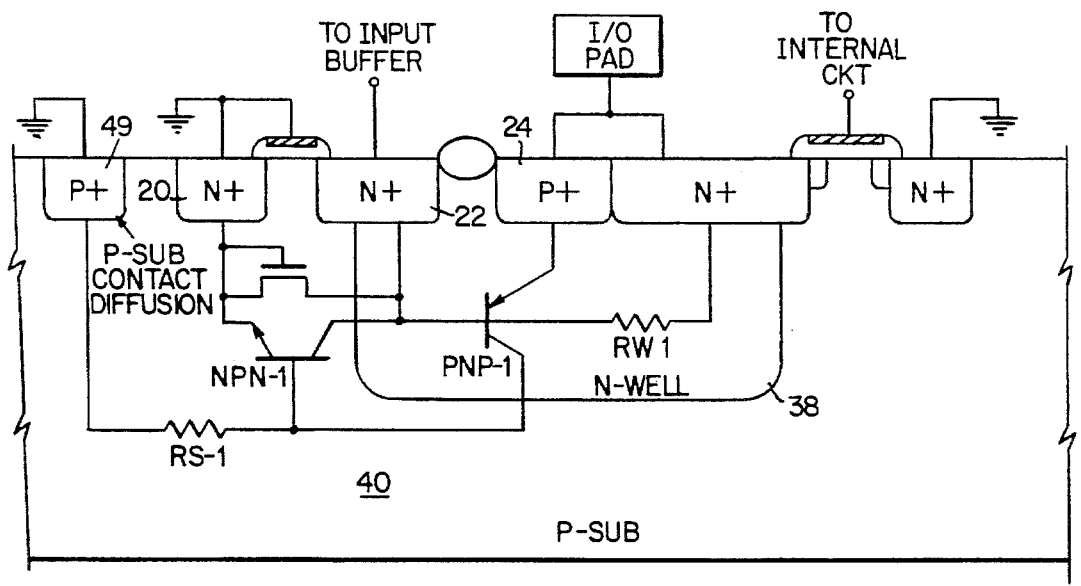
FIG. 6 shows the equivalent circuit of the protective SCR.
Figure 7:
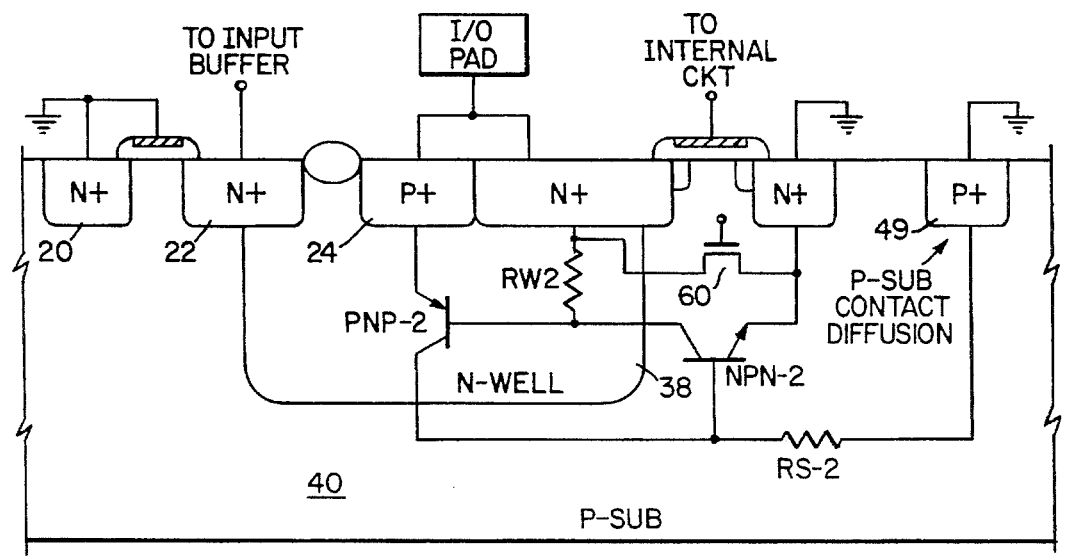
FIG. 7 shows the equivalent circuit of the output buffer which is protected.

FIG. 5 shows the equivalent circuit of the structure shown in FIG. 3. There are two SCRs, each formed by cross-coupling a pnp transistor with an npn trnsistor. The first SCR SCR1 forms the protection circuit shown in the left-hand section of FIG. 2, and the second SCR2 is the output NMOS to be protected shown in the right-hand section of FIG. 2. The left-hand section of FIG. 2 is redrawn in FIG. 6 to show the equivalent npn trnaisitor NPN1 with n+diffusion 20 as emitter, p-substrate as base and n+diffusion 22 as collector, and the equivalent pnp transistor PNP1 with p-substrate 40 as collector, n-well 38 as base and p+diffusion 24 as emitter. Between the base of NPN1 and the p+diffused contact 49 is a parasitic substrate resistance Rs1, and between the base of PNP1 and the n+ contact 26 of the n-well is a parasitic well resistance Rw1. The right-hand section of FIG. 2 is redrawn in FIG. 7 to show the equivalent pnp transistor PNP2 with p+diffusion 24 as emitter, n-well 38 as base and p-substrate 40 as collector, and an equivalent npn transistor NPN2 with n-well 38 at collector, p-substrate 40 as base and n+diffused source 52 at emitter. Between the p+substrate contact 49 and the base of NPN2 is a parasitic substrate resistance Rs2, and between the base of PNP2 and the n+contact 26 of the n-well is a parasitic well resistance Rw2. In the combined equivalent circuit shown in FIG. 5, the trigger non-LDD NMOS device FPD, (which stands fox field plate device or grounded gate thin oxide device and corresponds to label 42 in FIG. 2) is connected between the collector node 22 and the emitter node 20 of NPN1. The drain of the pull-down LDD NMOS 60 is connected to node 50 in FIG. 2; and the source, to node 52. Due to the lower breakdown voltge of non-LDD device 42, PNP1 turns on SCR1 first. During normal operation when there is no ESD, the drain current of the pull-down NMOS flows through the lightly-doped junction and cannot turn on SCR2. Therefore, during normal operation, there is no latch-up problem.

Figure 8:
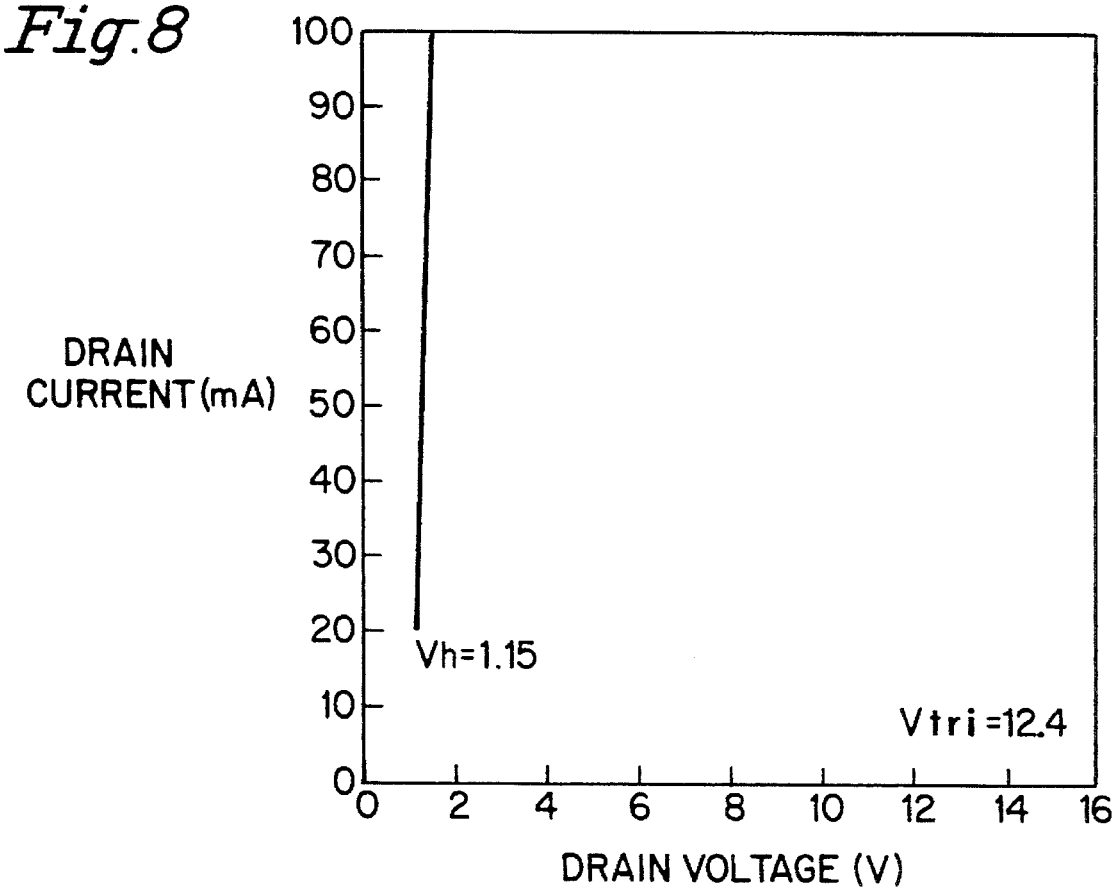
FIG. 8 shows the DC I-V characteristic of the output buffer with built-in SCR ESD protection.

FIG. 8 shows the DC characteristic of the output buffer with built-in SCR protecion. It can be seen that when the drain voltage at the output pad exceeds the breakover voltage Vtri=12.4 V, the SCR is triggered to a low voltage state with a holding voltage Vh=1.15 V. In other words, the output pad is clamped to approximately 1.15 V when there is ESD, and original condition is restored after the output pad falls below 1.15 V again.

Table I shows the performance of the output buffer with built-in SCR ESD protection. Using the "human body model" HBM for generating the ESD pulse, protection greater than 8000 volts is achieved; using the "machine model" MM, greater than 600 volts.

While the foregoing specification describes the ESD protection at the output pad and power supply pads of a CMOS IC using an n-well structure, it should be obvious that the same technique can be used for p-well structures by reversing the conductivity types of the semiconductor. It should also be noted that the protecion technique applies equally well for input pads.

What is claimed is:

1. A protection circuit against electrostatic discharge (ESD) for complementary metal-oxide-semiconductor (CMOS) integrated circuits (IC) of p-type substrate having n-channel MOS field effect transistors (NMOS) with lightly-doped drain (LDD) and having at least one bonding pad for external connection, comprising:

a first n-well having a heavily-doped n+diffusion and a heavily-doped p+diffusion connected together and to said bonding pad, a non-LDD NMOS, which does not have a lightly doped drain, having a drain connected to said first n-well, an n+ source connected to the negative terminal of a power supply with a positive terminal and a negative terminal, a gate connected to said source, and a channel having a effective channel length longer than the channel length of said NMOS with lightly-doped drain (LDD NMOS), said first n-well and said non-LDD NMOS forming a pnpn SCR structure, which turns on when said ESD pulse appears at said bonding pad, with said p+diffusion, said n-well, said p-substrate and said n+source corresponding to said pnpn strusture.

2. A protection circuit against ESD as described in claim 1, wherein said bonding pad is connected to the drain of an LDD NMOS output buffer with a source connected to said negative terminal of said power supply.

3. A protection circuit against ESD as described in claim 1, wherein said non-LDD drain is diffused into said first n-well.

4. A protection circuit against ESD as described in claim 1, wherein said drain of said LDD MNOS is diffused into said first n-well.

5. A protection circuit against ESD as described in claim 1, wherein said non-LDD NMOS has a gate oxide as thin as the gate oxide of said LDD NMOS.

6. A protection circuit against ESD as described in claim 1, wherein said non-LDD NMOS has a gate oxide thicker than the gate oxide of said LDD NMOS.

7. A protection circuit against ESD as described in claim 1, wherein there is a second n+diffusion, which is diffused outside the non-LDD NMOS away from said first n-well and connected to said positive terminal of said power supply, and forms a first abrupt junction npn bipolar transistor structure corresponding to the second n+diffusion as collector, the p-substrate as base and the n+source of the non-LDD NMOS as emitter.

8. A protection circuit against ESD as described in claim 7, wherein an oxide with a thickness equal to the gate oxide of the LDD NMOS is interposed over the p-substrate and between said second n+ diffusion and said n+source of said non-LDD NMOS.

9. A protection circuit ESD as described in claim 7, wherein an oxide with a thickness thicker than the gate oxide of the LDD NMOS is interposed over the p-substrate and between said second n+diffusion and said n+source of said non-LDD NMOS.

10. A protection circuit against ESD as described in claim 7, wherein there is a second n-well diffused inside said second n+diffusion.

11. A protection circuit against ESD as described in claim 7, wherein there is a third n+diffusion, which is placed outside said first n-well and connected to said positive terminal of said power supply, and forms a second abrupt junction npn bipolar transistor structure with said third n+diffusion as collector, the p-substrate as base and said n-well as emitter.

12. A protection circuit against ESD as described in claim 11, wherein the oxide covering said base is as thin as the thickness of the LDD NMOS.

13. A protection circuit against ESD as described in claim 11, wherein the oxide covering said base is thicker than the gate oxide of the LDD NMOS.

14. A protection circuit against ESD as described in claim 11, wherein there is a third n-well diffused inside said third n+diffusion.

15. A protection circuit against ESD as described in claim 1, wherein the n-type and p-type semiconductivity types are reversed.

16. A protection circuit against ESD as described in claim 8, wherein a polysilicon gate lager is deposited over said oxide which is interposed over said p-substrate and between said second n+diffusion and said n+source diffusion of said said non-LDD NMOS, and connected to said negative terminal of said power supply.

* * * * *